United States Patent
Grober et al.

(10) Patent No.: US 11,129,314 B2
(45) Date of Patent: Sep. 21, 2021

(54) STEPPED COMPONENT ASSEMBLY ACCOMMODATED WITHIN A STEPPED CAVITY IN COMPONENT CARRIER

(71) Applicant: AT & S Austria Technologie & Systemtechnik Aktiengesellschaft, Leoben (AT)

(72) Inventors: Gernot Grober, Allerheiligen (AT); Sabine Liebfahrt, Kapfenberg (AT); Christian Vockenberger, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 56 days.

(21) Appl. No.: 16/434,962

(22) Filed: Jun. 7, 2019

(65) Prior Publication Data
US 2019/0380234 A1 Dec. 12, 2019

(30) Foreign Application Priority Data
Jun. 11, 2018 (EP) .................................. 18177077

(51) Int. Cl.
*H05K 13/00* (2006.01)
*H01L 21/673* (2006.01)

(52) U.S. Cl.
CPC ... *H05K 13/0084* (2013.01); *H01L 21/67333* (2013.01)

(58) Field of Classification Search
None
See application file for complete search history.

(56) References Cited

U.S. PATENT DOCUMENTS

| 8,837,159 | B1 | 9/2014 | Buuck |
| 9,601,461 | B2 * | 3/2017 | Ho ...................... H01L 23/5383 |
| 2004/0212065 | A1 | 10/2004 | Wang |
| 2009/0203171 | A1 | 8/2009 | Takemasa et al. |
| 2010/0213600 | A1 | 8/2010 | Lau et al. |

FOREIGN PATENT DOCUMENTS

| CN | 203086852 U | 7/2013 |
| EP | 0 729 180 A2 | 8/1996 |
| EP | 3 131 117 A1 | 2/2017 |
| JP | 2000150696 A | 5/2000 |
| JP | 2009290142 A | 12/2009 |
| WO | 2013/009738 A1 | 1/2013 |

* cited by examiner

*Primary Examiner* — Bradley Smith
(74) *Attorney, Agent, or Firm* — Robert A. Blaha; Smith Tempel Blaha LLC

(57) ABSTRACT

An electronic package includes a component carrier having a stepped cavity formed therein; and a component assembly having at least two electrically connected electronic components with different sizes such that the component assembly has a stepped shape. The component assembly is accommodated at least partially inserted within the stepped cavity. Further described is a method of manufacturing such an electric package.

15 Claims, 4 Drawing Sheets

STEPPED COMPONENT ASSEMBLY ACCOMMODATED WITHIN A STEPPED CAVITY IN COMPONENT CARRIER

CROSS-REFERENCE TO RELATED APPLICATIONS

This application claims the benefit of the filing date of the European Patent Application No. 18 177 077.7 filed 11 Jun. 2018, the disclosure of which is hereby incorporated herein by reference.

TECHNICAL FIELD

The present invention generally relates to the technical field of electronic packages. In particular, the present invention relates to a highly integrated electronic package having a component carrier and electronic components being embedded at least partially within the component carrier. Further, the present invention relates to a method for manufacturing such an electronic package.

TECHNOLOGICAL BACKGROUND

Component carriers onto which electronic assemblies comprising several electronic components are built up are widely used in many electronic consumer devices such as for instance (a) computing devices, e.g. desktop computers, notebooks, cellular phones, tablet computers, etc., (b) wireless data communication devices, e.g. cellular phones, telephones, routers, Near Field communication devices, etc., and (c) wired devices, e.g. monitors, television, etc. This enumeration is not complete and the number and the type of electronic devices having electronic assemblies built up at component carriers is continuously getting larger.

In order to increase the integration density of electronic assemblies there have been developed component carriers which in addition of providing mechanical support and electric connections for electronic components provide some electric functionality by embedding active or passive electronic components. In this context embedding electronic components within a component carrier such as a Printed Circuit Board (PCB) may also be understood as a possibility for packaging electronic components such as semiconductor chips.

Higher and especially heterogeneous integration is a key driver for new pack-aging technologies and/or miniaturized consumer devices. In addition, there is a continuous demand to miniaturize electronic assemblies especially in directions parallel to a main surface of a component carrier which requires a stacking of components along a vertical direction, i.e. perpendicular to the main surface of the respective component carrier.

JP 2009 290142 A discloses a PCB incorporating an electronic component in order to enhance packaging density. The PCB includes a first high-density PCB, a second low density PCB, and two Integrated Circuit (IC) chips as electronic components mounted on the first high-density PCB. Both IC chips have the same spatial dimensions. In the second low density PCB an opening is provided within which the first high-density PCB together with the two IC chips is embedded.

SUMMARY

There may be a need for providing a solution for embedding in an effective and flexible manner at least two electronic components within a cavity formed within a component carrier.

This need may be met by the subject matter according to the independent claims. Advantageous embodiments of the present invention are described by the dependent claims.

According to an embodiment of the present invention, a method for manufacturing an electronic package includes the steps of forming a component carrier with a stepped cavity; providing a component assembly comprising at least two electrically connected electronic components having different sizes such that the component assembly has a stepped shape; and inserting the component assembly in the stepped cavity such that the component assembly is accommodated at least partially within the stepped cavity.

According to an alternative embodiment, an electronic package includes a component carrier having a stepped cavity formed therein; and a component assembly with at least two electrically connected electronic components having different sizes such that the component assembly has a stepped shape; where the component assembly is accommodated at least partially inserted within the stepped cavity.

OVERVIEW OF EMBODIMENTS

In the context of this document, the term "component carrier" may denote any support structure which is capable of accommodating one or more (electronic) components thereon and/or therein for providing mechanical support and/or electrical connectivity. In other words, a component carrier may be configured as a mechanical and/or electric carrier for components. Electrical conductivity is provided by conductor paths which may be formed at the surface of the component and/or within inner structured electrically conductive layers of the component carrier being realized as a so-called multilayer component carrier.

In particular, a component carrier may be one of a Printed Circuit Board (PCB), an (organic) interposer, and a substrate. A component carrier may also be a hybrid board combining different ones of the above-mentioned types of component carriers.

In an embodiment, the component carrier comprises a stack of at least one electrically insulating layer (structure) and at least one electrically conductive layer (structure). For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may in particular denote a continuous layer, a patterned layer or a plurality of non-consecutive islands within a common plane.

In an embodiment, the component carrier is shaped as a plate. This contributes to a compact design, wherein the component carrier nevertheless provides a large basis for mounting components thereon. Furthermore, in particular a naked die as example for an electronic component embedded within the stepped cavity, can be conveniently embedded, thanks to its small thickness, into a thin plate such as a printed circuit board.

In this document the term "Printed Circuit Board" (PCB) may particularly denote a component carrier which is formed by laminating several electrically conductive layer structures with at least one electrically insulating layer structure, for instance by applying pressure, if desired accompanied by the supply of thermal energy. A PCB may be plate-shaped (i.e. planar), three-dimensionally curved (for instance when manufactured using 3D printing) or may have any other shape. As preferred materials for PCB technology, the electrically conductive layer structures are made of copper, whereas the electrically insulating layer structures may comprise resin and/or glass fibers, so-called prepreg material or, after curing, FR4 material. The various electrically conductive layer structures may be connected to one another in a desired way by forming through-holes through the laminate, for instance by laser drilling or mechanical drilling, and by filling them with electrically conductive material such as in particular copper, thereby forming vias as through-hole connections. Alternatively, at least some via connections may be realized by means of blind vias. Apart from one or more (electronic) components which may be embedded, a PCB is usually configured for accommodating one or more components on one or both opposing surfaces of the plate-shaped PCB. They may be connect-ed to the respective main surface by soldering. A dielectric part of a PCB may be composed of resin with reinforcing fibers such as e.g. glass fibers.

In this document the term "substrate" may particularly denote a small component carrier. More specifically, a substrate can be understood as a carrier for electrical connections or electrical networks as well as component carrier comparable to a Printed Circuit Board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components such as bare dies or semiconductor IC chips, with a PCB or intermediate PCB. Thus, the term "substrate" may also include "IC substrates". A dielectric part of a substrate may be composed of resin with reinforcing spheres (such as glass spheres).

The described at least one electrically insulating layer structure may comprise at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-spheres, glass-like materials), prepreg material, photoimageable dielectric material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg, FR4, epoxy-based Build-Up Film or photoimageable dielectrics are usually preferred, other materials may be used as well. For high frequency applications, high-frequency materials such as poly-tetrafluoroethylene, liquid crystal polymer and/or cyanate ester resins may be implemented in the component carrier as electrically insulating layer structure.

The at least one electrically conductive layer structure may comprise at least one of the group consisting of copper, aluminum, nickel, silver, gold, palladium, and tungsten. Although copper is usually preferred, other materials or coated versions thereof are possible as well, in particular coated with supra-conductive material such as graphene.

Apart from the described at least two electrically connected electronic components there may be accommodated at least one further component within the stepped cavity or within a further cavity formed within the component carrier. One of the at least two electronic components and/or the further component can be selected from a group consisting of an electrically non-conductive inlay, an electrically conductive inlay (such as a metal inlay, preferably comprising copper or aluminum), a heat transfer unit (for example a heat pipe), an active or passive electronic component, or combinations thereof. For example, the component can be an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a (further) component. Such a magnetic element may be a permanent magnetic element (such as a ferro-magnetic element, an antiferromagnetic element or a ferrimagnetic element, for instance a ferrite core) or may be a paramagnetic element. However, the (further) component may also be a further component carrier, for example in a board-in-board configuration. The (further) component may be surface mount-ed on the component carrier and/or may be embedded in an interior thereof. Moreover, also other components, in particular those which generate and emit electromagnetic radiation and/or are sensitive with regard to electromagnetic radiation propagating from an environment, may be used as the (further) component.

The component carrier may be a laminate-type component carrier. In such an embodiment, the component carrier is a compound of multiple layer structures which are stacked and connected together by applying a pressing force, if desired accompanied by heat.

According to a first aspect of the invention there is provided an electronic package comprising (a) a component carrier having a stepped cavity formed therein; and (b) a component assembly comprising at least two electrically connected electronic components having different sizes such that the component assembly has a stepped shape. The component assembly is accommodated at least partially inserted within the stepped cavity.

According to an exemplary embodiment, the described electronic package is based on the idea that a stack of spatially different electronic components can be integrated or embedded within a component carrier in an easy and reliable manner simply by providing an appropriately dimensioned or formed cavity having a stepped shape. Thereby, the shape and the size of the cavity is at least approximately complementarity to the shape and the size of at least a portion of the component assembly.

The cavity may be formed and dimensioned in such a manner that the stepped component assembly exactly fits into the cavity. Alternatively, component assembly and stepped cavity may be dimensioned in such a manner that, when the component assembly is inserted respectively accommodated within (at least a part of) the cavity, there remains a gap in between at least one outer surface of the stepped component assembly and the respective inner side wall of the stepped cavity. Preferably, there are provided many gaps, respectively one between one outer surface of the component assembly and the corresponding side wall of the stepped cavity. The gap(s) may be filled with functional materials which may absorb mechanical stress and/or which carry away heat from the component assembly when being in operation. Further, the gap(s) may be filled with a mold and/or an appropriate underfill material in order to provide certain stiffness to the described electronic package and/or an improved operational reliability.

The stepped cavity may allow to receive the component assembly fully or at least partially. Independent from the degree of "component assembly reception" the stepped cavity has the effect that along a z-direction the dimension of the electronic package, i.e. the component carrier and the component assembly, will be smaller than a corresponding extension along the z-direction when (the stack of) the at least two electrically connected electronic components is placed or mounted at an upper or lower surface of a component carrier. Further, the size and the shape of the stepped cavity may be such that an (upper) surface of the component assembly is located at least approximately in the same plane as the (upper) surface of the component carrier. This means that the electronic package has a flat (upper) surface which is defined in part (i) by the (upper) surface of the component assembly and (ii) by the (upper) surface of the component carrier. Of course, the same considerations with regards to "flatness" also apply to a lower surface of the component assembly respectively a lower surface of the component carrier. Designing the electronic package in such a manner that component assembly and the component carrier form a common upper and/or lower plane may provide the advantage that on the one hand the component assembly is well protected by the component carrier and on the other hand it is easy to bring the component assembly into contact with a region being external to the component carrier. Thereby, the external region may be occupied by further electronic components or a further build-up structure like a PCB which may be used e.g. for electrically contacting the highly integrated electronic package with the "outside world".

The described accommodation of the stepped component assembly within the stepped cavity may allow to increase the integration density in particular (in the region) between the two electrically connected electronic components. This holds true because, by contrast to known solutions where more than one electronic component is embedded within the component carrier, there is no need to form electrical contacts within the component carrier material when only electric connections between the two electronic components are needed.

According to a further embodiment of the invention at least one of the at least two electronic components is a semiconductor chip, a substrate, an interposer, or a through silicon via connection (TSV). This means that the component assembly may be made from different electronic entities, which may be select-ed specifically for different applications of the described electronic package.

In case different types of electronic components are used for forming the component assembly it should be made sure that there are appropriate electric connection elements which allow for a (direct) electric contact between the at least two electronic components. This may be important in particular in case of a high integration density (of or between the at least two electronic components) which usually requires also a high spatial density of electric connections between the at least two electronic components.

According to a further embodiment of the invention the at least two electronic components are directly connected face to face.

The described face to face connections may include direct electric connections between the at least two electronic components. Thereby, the term "direct electric connection" may mean in particular that there are no redistribution layers or TSVs (through silicon vias) needed which run or which are guided via at least a portion of the component carrier and which may be realized in a known manner by means of conductor tracks and/or metallized vias. A direct face to face connection may provide the advantage that for electrically connecting the at least two electronic components it is not necessary to perform an (additional) lamination procedure as may be required for forming at least a part of the described component carrier. As a consequence, a manufacturing of the described electronic package will be simplified. Thereby, a substantial yield improvement with respect to the amount of "working" electronic assemblies may be achieved. In this context benefit may be taken from the matter of fact that "known good electronic (die) components" will be electrically combined with each other by means of a direct z-axis interconnection. The resulting component assembly may be tested in order to verify that it is a working component assembly. Next, this working component assembly can be combined with a "known good component carrier".

The electric connections within the component assembly respectively between the at least two electronic components may be realized with appropriate electric connection elements such as e.g. solder balls, thermal compression bonding, etc. When manufacturing the electronic package these electric connections may be realized before the component assembly is inserted respectively is placed into the stepped cavity. Alternatively, the at least two electronic components are electrically put together with a formation of the component carrier whereby different component carrier portions are attached together e.g. by means of a lamination procedure.

It is pointed out that apart from (direct) electric connections between the at least two electronic components there may be provided further electric connection paths to or from the component assembly which run through the component carrier. Such connection paths may be used in particular for electrically connecting the component assembly to outer circuitry. Thereby, the term "outer circuitry" may refer to any electronic assembly which is external to the described electronic package. Thereby, the "outer circuitry" may be connected to the electronic package by means of a (flexible) wiring. Alternatively, the "outer circuitry" may be realized within or at a so-called build-up structure being set up or being mounted to the described electronic package, in particular to the component carrier of the described electronic package.

According to a further embodiment of the invention the component assembly comprises an intermediate electric structure, wherein the two electronic components are attached at opposing main surfaces of the intermediate electric structure.

The intermediate electric structure may be an IC substrate or an interposer. The substrate or interposer may consist of at least a layer of glass, Silicon (Si) or a photoimageable or dry-etchable organic material like epoxy-based Build-Up films or polymer compounds like Polyimide, Polybenzoxazole, or Benzocyclobutene.

In some applications the intermediate electric structure may be a PCB like structure having a high spatial density of vertical electric connections wherein neighboring electric connections have an average distance or at least a distance in some sections of the intermediate electric structure of less than 150 μm and preferably less than 75 μm. The same spatial distances or even smaller distances are given for an interposer or a substrate having the two electronic components mounted thereto at opposing surfaces of the interposer or substrate. In preferred embodiments the high integration density of electric connections is realized with an interposer or a substrate being free from typical materials for electrically insulating layer structures of PCBs comprising glass fibres like FR4 material. Thus, an even higher density of connections is possible wherein the neighboring vertical electric connections may have a distance in some sections of the intermediate electric structure of less than 30 µm and preferably less than 15 µm. Ultra-high-density electric connections between the at least two components having a distance of the neighboring vertical electric connections in some sections of the intermediate electric structure below 5 µm may be realized by means of so called "Through-Silicon Vias".

It is pointed out that in some embodiments two or even more electronic components are arranged juxtaposed at one and the same main surface of the intermediate electric structure.

According to a further embodiment of the invention the stepped cavity forms a through hole opening or a blind hole opening within the component carrier. This may provide the advantage that depending on the specific application the electronic package can be realized in an appropriate manner.

Specifically, using a through hole opening for realizing the stepped cavity may provide the advantage that the stepped cavity can be formed or manufactured within the component carrier in an easy manner. Thereby, the stepped cavity may be formed by means of a two-step process. In a first step a through hole opening having a lateral dimension corresponding to a narrow portion of the stepped cavity can be formed through the component carrier. In a second step, a blind hole opening having (i) a lateral dimension corresponding to a wide portion of the stepped cavity and (ii) a depth being smaller than the entire thickness of the component carrier is formed within the component carrier. Thereby, the order or the sequence of performing these two steps is arbitrary and may depend on the specific manufacturing process.

Using a blind hole opening may provide the advantage that the stepped component assembly may be accommodated within the stepped component carrier in a particular reliable manner. Further, the material respectively the layer(s) being present at the bottom respectively below the stepped cavity may serve for the protection of the component assembly at least from (mechanical) impacts acting on the electronic package from a bottom side of the component carrier. In this context the term "bottom" refers to the main surface of the component carrier which is not opened by the stepped cavity respectively which forms a portion of the layer(s) which are located at the closed end of the blind hole opening stepped cavity.

It is pointed out that for a blind hole opening stepped cavity it may be possible that there is provided, at least temporarily during manufacturing the electronic package, a small passage at the bottom of the stepped cavity connecting the stepped cavity to the main surface of the component carrier. Thereby, this main surface is located close to the substantially closed end of the stepped cavity. Such a small passage may be of advantage in order to avoid an entrapment of air during insertion of the component assembly and/or in order to inject an underfill material within the stepped cavity from respectively at its bottom side.

According to a further embodiment of the invention the component carrier comprises (a) a first component carrier portion having a first opening formed therein, wherein the first opening corresponds to a narrower portion of the stepped cavity; and (b) a second component carrier portion having a second opening formed therein, wherein the second opening corresponds to a wider portion of the stepped cavity. Thereby, the first component carrier portion and/or the second component carrier portion may be formed by a laminate comprising at least one electrically insulating layer (structure) and one electrically conductive layer (structure).

When manufacturing the described electronic package, the first opening can be formed within the first component carrier portion and the second opening can be formed within the second component carrier portion before connecting the two component carrier portions in order to form the component carrier with the stepped cavity. In this context it should be clear that during such a connection process it has to be made sure that the two component carrier portions are attached to each other with a proper alignment such that in a lateral direction (parallel to the main surface of the component carrier) the second opening is located in the region of the first opening. Preferably, the two component carrier portions are aligned in such a manner that with respect to lateral directions the second opening is centered with regard to the first opening. Thereby, a lateral direction is oriented parallel to a main plane of the first component carrier portion, the second component carrier portion and/or the entire component carrier. Of course, also other non-symmetric component assemblies and correspondingly shaped stepped cavities may be employed for realizing the described electronic package.

Further, when manufacturing the described electronic package, the component assembly comprising already the at least two electrically connected electronic components can be inserted within the stepped cavity after the two component carrier portions has been laminated. Alternatively, a first electronic component of the component assembly can be inserted (at least partially) in the first opening of the first component carrier portion and a second electronic component of the component assembly can be inserted (at least partially) in the second opening of the second component carrier portion. This means that the electric connection between the two electronic components will be realized when the two component carrier portions are attached to each other. This may provide the advantage that at least one of the two electronic components can be electrically tested after having been inserted into the respective opening but before completing a fabrication of the component assembly respectively the described electronic package.

Descriptively speaking, both parts of the electronic package could be manufactured in parallel and tested such that only working parts can be put together. In this context one part of the electronic package refers to one of the two component carrier portions and the respective electronic component being accommodated or inserted within its opening. Thereby, the yield of manufacturing working electronic packages can be increased because defective parts respectively defective electronic components can be removed from the manufacturing process.

According to a further embodiment of the invention the component assembly is vertically embedded within the component carrier. This may mean that the component assembly is not only laterally covered by the stepped cavity but also covered at its upper side and lower side. Thereby, a hermetic sealing of the component assembly may be realized which may be of advantage for many different applications of the described electronic package.

In case of a blind hole opening the described vertical embedding may be realized (at the bottom side) by layer(s) of the component carrier which are located below the stepped cavity. The upper side of the component assembly may be covered by additional (laminate) layers of the component carrier, which layers are formed after the component assembly has been inserted into the stepped cavity. In case of a though hole opening a coverage of the component assembly both at its upper side and its lower side may be realized by such additional (laminate) layer(s).

It is mentioned that (also) in between the two component carrier portions there may be present an intermediate laminate which may facilitate a lamination of the two component carrier portions. This intermediate laminate may be for instance a so-called B-stage laminate which is (fully) cured during the lamination of the two component carrier portions and the intermediate laminate being located between the two component carrier portions.

In this respect it is mentioned that the term "B-stage material" refers to an "at least partially uncured material" which has the property to at least partially melt or become flowable by the application of elevated pressure and/or elevated temperature, and become fully hardened or cured (and thereby becomes solid) when releasing the applied elevated pressure and/or elevated temperature. Consequently, applying elevated pressure and/or elevated temperature may cause melting of the curable or at least partially uncured material, followed by an irreversible hardening upon releasing the applied high pressure and/or high temperature. By providing a layer (structure) with resin, prepreg or any other B-stage material the layer (structure) may re-melt during lamination so that resin (or the like) may flow for interconnecting the various elements and for closing gaps or voids and may therefore contribute to a stable intrinsic inter-connection within the component carrier under manufacture. Upon connecting such a structure by the application of pressure and/or heat, i.e. by lamination, only the low-flow prepreg or no-flow prepreg will re-melt slightly and accomplish a local connection. Two fully cured layer structures will not establish a mutual adhesive connection, allowing to subsequently take out a piece delimited by a circumferential milling line and a connection area between the two fully cured layer structures.

It is pointed out that instead of a lamination procedure a mechanical and electric connection between the various layer structures may be realized e.g. by employing a conductive glue or an anisotropic conductive film (ACF). Further, layer structures may also be formed and mechanically and electrically connected with other layer structures by known procedures.

According to a further embodiment of the invention an upper surface of the component assembly is located within the plane being defined by an upper surface of the component carrier. This may provide the advantage that the component assembly and the component carrier may precisely form a flat surface (at the upper side of the electronic package). This may facilitate a further production of the electronic package and/or may be useful for many applications of the electronic package.

According to a further embodiment of the invention the electronic package further comprises a through hole connecting the exterior of the component carrier (respectively the electronic package) with the component assembly. Thereby, the electronic package may further comprise at least one further through hole. Thereby, the through hole and the further through hole may have a different cross-sectional area.

The through hole may be used for injecting materials such as a resin into the stepped cavity in order to fill gaps being present between at least one of the two electronic components of the electronic assembly and at least one sidewall of the stepped cavity. Thereby, both a smooth and reliable embedding of the component assembly within the stepped cavity can be realized. At this point it is mentioned that instead of a material injection also a coating knife/scraper or a screen-printing procedure can be used for can be used for filling the gaps.

The at least one through hole may be further used as a passage for transfer-ring substances to be analyzed from the exterior of the electronic package to the component assembly, which in this case is a sensor such as e.g. a gas sensor. Thereby, it may be beneficial not only to provide only one through hole but at least two through holes, wherein one through hole is used for supplying the respective substance from the exterior of the electronic package to (the sensing portion or part) of the electronic assembly and the other through hole is used for discharging the analyzed substance away from the component assembly.

The through hole may be realized by a cylindrical opening having a certain diameter. This means that the through hole may be formed by known mechanical or laser drilling procedures. This may significantly facilitate the manufacturing of the described electronic package having at least one through hole (connection) between the component assembly and the exterior of the component carrier.

Providing the further through hole may allow for realizing complex structures when configuring the described electronic package for different applications wherein additional functional elements have to be integrated within the component carrier and/or further additional layers formed above and/or below the component carrier.

Different through hole geometries may be realized in a known manner by milling, drilling and/or by using differently and appropriately precut laminate (layers) when laminating the component carrier.

When configuring the electronic package for sensor applications it may also be useful to employ different through hole geometries, in particular different through hole cross sections and further in particular different through hole diameters. In this way complex analysis structures may be used in particular for simultaneously sensing different substances.

According to a further embodiment of the invention at least one electronic component of the at least two electronic components of the electronic assembly is a sensor.

Depending on the application the described electronic component supposed to be used for the sensor may be an optoelectronic sensor, a gas sensor, a temperature sensor, a magnetic field sensor, an electric field sensor etc. Preferably, the sensor is realized by this electronic component of the component assembly, which electronic component is the smaller electronic component. The other larger electronic component may be used for processing and/or for evaluating measurement signals provided by the sensing electronic component and/or for providing electric power to the sensing electronic component.

Depending on the specific application a sensing surface of the sensing electronic component may located outside from the component carrier or recessed within the component carrier. Further, the sensing surface may form a flat plane together with the corresponding surface of the component carrier. Arranging the sensing surface outside from the component carrier may provide the advantage that the environment of the electronic package can be sensed easily. Arranging the sensing surface within a recess (being a part of the stepped cavity) may provide the advantage that the sensing electronic component is protected from unwanted (mechanical) impacts acting on the electronic package. Such a protection can be increased by means of a suitable protection material, e.g. a transparent mold, being formed within the recess and/or over the sensing surface. Embodiments where the sensing surface of the sensing electronic component coincides with the corresponding surface of the component carrier may allow to design the electronic package in such a manner that the sensor is integrated within the electronic package without being visible from outside.

In some embodiments the electronic package comprises a sensing electronic component which (i) has a sensing surface being located within the plane of the corresponding outer surface of the component carrier and which (ii) has the (electric) connection pads on the same side as the sensing surface.

According to a further embodiment of the invention the electronic package further comprises a heat conduction element being in thermal contact with the component assembly. Alternatively or in combination, the component assembly further comprises at least one further electronic component being electrically connected with at least one of the two electrically connected electronic components.

The described heat conduction element may be located within the component carrier and/or external to the component carrier but e.g. within additional (laminate) layer(s) of the electronic package. The heat conduction element may further be in thermal contact with a cooling element being mounted in particular at an outside surface of the electronic package.

A component assembly comprising at least three electrically connected electronic components may provide the advantage that further functionality can be added to the component assembly. Thereby, the at least one further electronic component may be arranged next to or juxtaposed one of the two electrically connected electronic components. In other embodiments the further electronic component is stacked on one of the two electrically connected electronic components such that as a result a stack of three electronic components forms the described component assembly.

It is pointed out that in some embodiments with three stacked electronic components wherein each electronic component has a different size a two times stepped cavity may be formed within the component carrier. Thereby, the shape and the size of a three-component assembly may correspond to the shape and the size of two times stepped cavity. Again, appropriate gaps may be formed between the outer side walls of the component assembly and the inner sidewalls of the stepped cavity.

According to a further aspect of the invention there is provided a method of manufacturing an electronic package. The provided method comprises (a) forming a component carrier with a stepped cavity; (b) providing a component assembly comprising at least two electrically connected electronic components having different sizes such that the component assembly has a stepped shape; and (c) inserting the component assembly in the stepped cavity such that the component assembly is accommodated at least partially within the stepped cavity.

Also, the described method is based on the idea that an electronic package with at least two embedded electronic components having different sizes can be realized by combining the at least two electrically connected electronic components to a stepped component assembly and providing a corresponding stepped cavity within the component carrier into which the component assembly is accommodated.

According to an embodiment of the invention forming a component carrier comprises (a) providing a first component carrier portion having a first opening formed therein, wherein the first opening corresponds to a narrower portion of a stepped cavity, which comprises the first opening and a second opening corresponding to a wider portion of the stepped cavity; (b) providing a second component carrier portion; and (c) attaching the two component carrier portions to each other.

As already mentioned above both component carrier portions may be formed by laminating at least one electrically insulating layer (structure) and one electrically conductive layer (structure) together. The openings may be formed after such a lamination process in a known manner e.g. by means of milling or drilling procedures.

The terms "wider" and "narrower" refer to a direction being oriented parallel to a main (surface) plane of the component carrier. Thereby, the main (surface) plane is the plane where further electronic components can be (surface) mounted to the component carrier and/or at which a (further) build-up (PCB) structure can be attached.

It is mentioned that at least one surface of the electronic package can be designed in such a manner that the entire package can be connected (electrically and/or mechanically) with another system such as a PCB e.g. by means of a known soldering procedure.

According to a further embodiment of the invention the provided second component carrier portion has the second opening or the second opening is formed within the second component carrier portion after attaching the two component carrier portions to each other.

Descriptively speaking, according to the first alternative the two openings may be formed before a lamination process is carried out with which the two component carrier portions are attached to each other. In this case the openings may be formed within corresponding prepreg layer structures. Thereby, when laminating a proper alignment between the two component carrier portions is essential in order to form a stepped cavity with proper geometric dimensions.

According to the second alternative at least the second opening is formed after such a lamination process between the two component carrier portions. Again, appropriate structuring techniques such as milling and/or drilling may be employed.

According to a further embodiment of the invention (A) before attaching the two component carrier portions to each other the method further comprises attaching the stepped component assembly to the first component carrier portion such that a first portion of the stepped component assembly is inserted within the first opening. Alternatively or in combination, the method further comprises (B) attaching the stepped component assembly to the second component carrier portion such that a second portion of the stepped component assembly is inserted within the second opening.

In this context, the first portion of the stepped component assembly may refer to a first one of the two electrically connected electronic components and the second portion of the stepped component assembly may refer to the second one of the two electrically connected electronic components.

It is pointed out that the embodiment, where both attaching steps, i.e. the step of attaching the stepped component assembly to the first component carrier and the step of attaching the second component assembly to the second component carrier, are carried out, the electric connection between the two electronic components of the stepped component assembly may be realized together with a lamination of the two component carrier portions. In embodiments where only one of these attaching steps is carried out, the two electronic components of the stepped component assembly are preferably getting electrically connected with each other already when forming the component assembly (and before attaching respectively laminating the two component carrier portions to each other).

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

Figure 1:
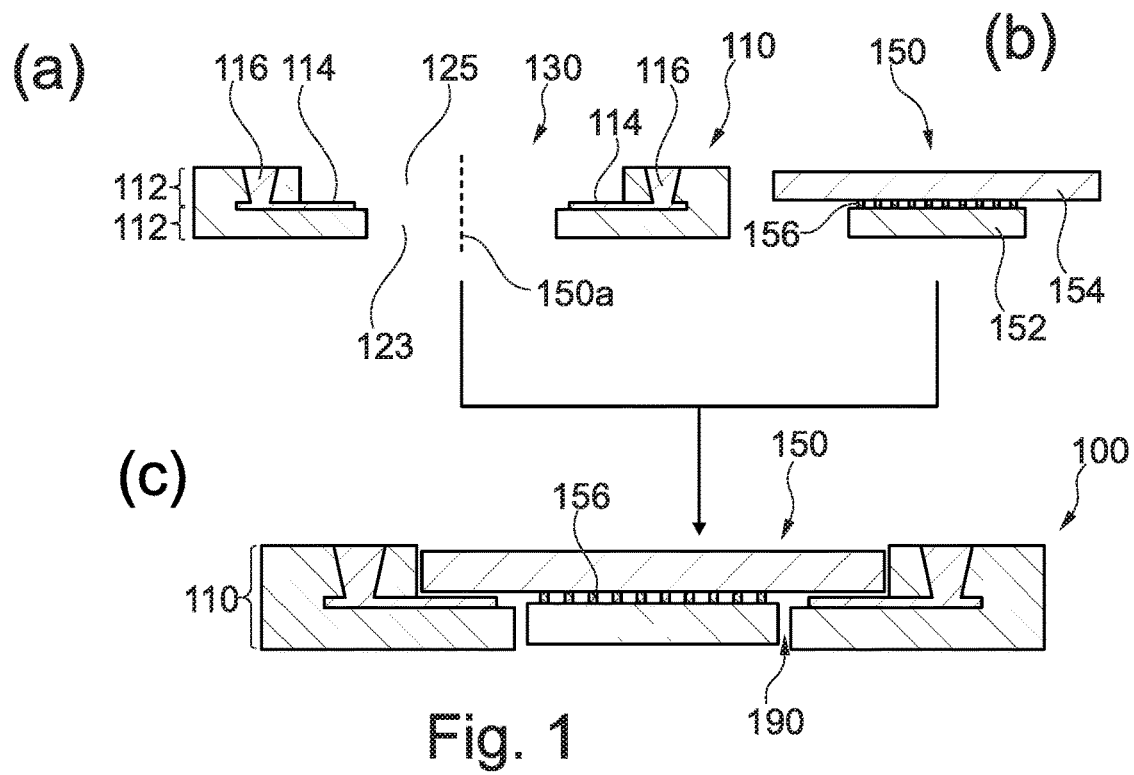
FIG. 1 illustrates a fabrication of an electronic package comprising a component carrier and an embedded stepped component assembly with two directly interconnected electronic components.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features, which have already been elucidated with respect to a previously described embodiment, are not elucidated again at a later position of the description.

Further, spatially relative terms, such as "front" and "back", "above" and "below", "left" and "right", et cetera are used to describe an element's relation-ship to another element(s) as illustrated in the Figures. Thus, the spatially relative terms may apply to orientations in use which differ from the orientation depicted in the Figures. Obviously, all such spatially relative terms refer to the orientation shown in the Figures only for ease of description and are not necessarily limiting as an apparatus according to an embodiment of the invention can assume orientations different than those illustrated in the Figures when in use.

FIG. 1 illustrates a fabrication of an electronic package 100 comprising a component carrier 110 and a stepped component assembly 150 being embedded within the component carrier 110. FIG. 1(a) shows the prepared component carrier 110 into which the stepped component assembly 150 is to be inserted. The stepped component assembly 150 is shown in FIG. 1(b). The electronic package 100, which results (i) from inserting the stepped component assembly 150 into the component carrier 110 and (ii) from optional further non-illustrated (post) processing steps, is shown in FIG. 1(c).

As can be taken from FIG. 1(a), according to the embodiment described here the component carrier 110 is a laminate having two electrically insulating layers or layer structures 112. In between the two (laminated) layers 112 there is formed a structured electrically conductive layer 114. Of course, also more than two (structured) electrically conductive layers can be provided between the two layers 114. Metallized vias 116 extend from different regions of the structured electrically conductive layer 114 up to a top or upper surface of the component carrier 110. For the ease of illustration, contact pads formed on top of or over the upper electrically insulating layer 112 are not depicted.

Within the lower electrically insulating layer 112 there is formed a first opening 123. Within the upper electrically insulating layer 112 there is formed a second opening 125. According to the embodiment described here the first opening 123 has a smaller lateral extension than the second opening 125. Therefore, in this document the first opening is denominated a narrow(er) opening 123 and the second opening is denominated a wide(r) opening 125. The two openings 123 and 125 together form a stepped cavity 130. In this embodiment, the two openings 123 and 125 are aligned with respect to a central axis 150a. The central axis 150a, which is a common central axis for both openings 123, 125, is oriented vertically with respect to a not depicted horizontal axis being oriented parallel to a main surface of the component carrier 110.

In other words, the laminated component carrier 110 comprises a laminate material which has (i) one narrow passage which extends vertically through the entire component carrier 110 and (ii) one wide passage which extends vertically only through one of the electrically insulating layers 112 and which therefore could be called a blind opening. It is essential that along the vertical direction the entire opening comprises a lateral step which causes a stepped shape of the stepped cavity 130.

In this context it is mentioned that the meaning of the terms "vertical" and "horizontal" is also used in other portions of the disclosure of this document. The "vertical" direction is also called z-direction. Horizontal directions are typically called x-direction respectively y-direction. Further, it is mentioned that in this document the terms "top" or "upper" and "bottom" or "lower" refer to the vertical direction.

The other part of the electronic package 100, i.e. the component assembly 150, comprises a first electronic component 152 and a second electronic component 154. According to the embodiment described here both electronic components 152, 154 are semiconductor dies. As can be seen from FIG. 1(b), the first (lower) semiconductor die 152 has a smaller lateral extension than the second (upper) semiconductor die 154. Therefore, both electronic components 152, 154 form a component assembly 150 which has a stepped shape. Therefore, in this document the component assembly 150 is also denominated a "stepped component assembly". According to the embodiment described here both electronic components 152, 154 are aligned with respect to a non-depicted vertical axis. This means, that in this embodiment not only the stepped cavity 130 shown in FIG. 1(a) but also the stepped component assembly 150 has an axial symmetric shape.

As can be further seen from FIG. 1(b) the two electronic components 152, 154 are oriented face to face and are electrically connected with each other by means of several electric connection elements 156. The electric connection elements 156 may be realized for instance by means of solder balls. This means that the two electronic components 152, 154 are electrically connected with each other in a direct manner. This means that in the embodiment described here between the two electronic components 152, 154 there is no intermediate electronic structure such as for instance an interposer.

The shape of the stepped cavity 130 and the shape of the stepped component assembly 150 basically correspond to each other. However, as can be seen from FIG. 1(c), the lateral extension of the stepped component assembly 150 is slightly smaller than the width of the stepped cavity 130. This means that after having inserted the stepped component assembly 150 into the stepped cavity 130 there remain gaps 190 between the outer side walls of the component assembly 150 and the corresponding inner sidewalls of the stepped cavity 130. Although not depicted in the Figures it is possible to fill these gaps 190 with a mold or an underfill material in order to provide of higher stiffness and a better reliability of the electronic package 100.

It is pointed out that it is also possible to embed the stepped component assembly into a complementarity formed stepped cavity when the component assembly comprises three or even more stacked electronic components. Of course, the number of differently dimensioned openings of a corresponding stepped cavity must be the same as the number of electronic components having different sizes. Further, in other embodiments it may also be possible to electrically connect two or more electronic components which are arranged (horizontally) next to each other with a larger electronic component. This means that although the component assembly will comprise more than two electronic components the component assembly will still have a shape having only one step.

It is further pointed out that at least one of the electronic components 152, 154 may have a sensing function for sensing a physical or chemical quantity. In this case preferably the smaller electronic component 152 is a corresponding sensor component.

Furthermore, it is pointed out that the component carrier 110 of the electronic package 100 can be seen as to represent a package for the stepped component assembly 150. This means that the electronic package 100 as depicted in FIG. 1(c) is a packaged integrated circuit arrangement, wherein two integrated circuit chips 152, 154 are commonly embedded within a package consisting of a component carrier or printed circuit board (PCB) material.

Figure 2A:
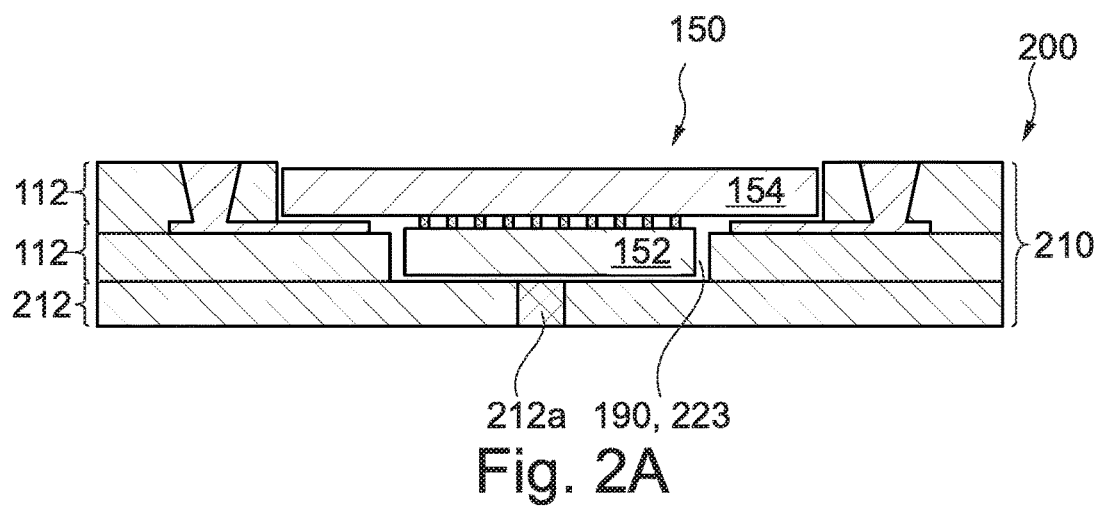
FIG. 2A shows an electronic package with a passage through a bottom layer of the component carrier reaching the bottom electronic component of an embedded stepped component assembly.

FIG. 2A shows an electronic package 200a which differs from the component carrier 100 in that a component carrier 210 embedding the stepped component assembly 150 within a stepped cavity comprises an additional electrically insulating layer 212. With regard to the layered structure of the component carrier 210 the opening within the upper electrically insulating layer 112 can be seen as to represent a through hole opening. Due to of the presence of the additional electrically insulating layer 212 the opening formed within the lower electrically insulating layer 112 can be seen as to represent a blind hole opening 223.

Within the region of the lower and smaller first electronic component 152 there is provided a passage 212a extending through the additional electrically insulating layer 212 such that from the exterior of the electronic package 200a the first electronic component 152 can be reached. This passage 212a can be used in order to (i) avoid an air entrapment when inserting the stepped component assembly 150 into the stepped cavity and/or to (ii) inject an underfill material into the stepped cavity in order to mechanically secure the stepped component assembly 150 within the stepped cavity.

Figure 2B:
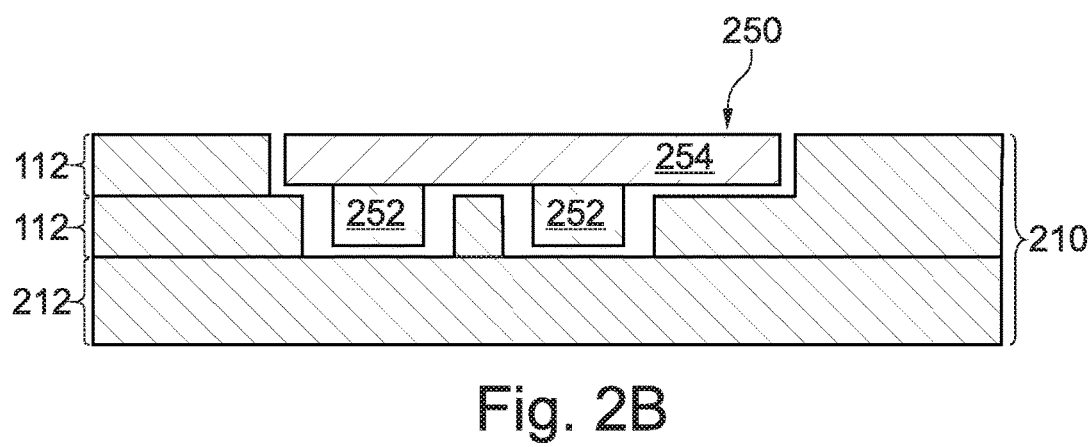
FIG. 2B shows an electronic package with an embedded stepped component assembly having one larger electronic component and two smaller electronic components interconnected with the larger electronic component.

FIG. 2B shows in a simplified illustration an electronic package 200b with an embedded component assembly 250 having one larger electronic component 254 and two smaller electronic components 252. According to the exemplary embodiment described here the two smaller electronic components 252 are electrically (and mechanically) interconnected with the larger electronic component 254 at one and the same surface of the larger electronic component 254. Thereby, each one of the two smaller electronic components 252 is interconnected with the larger electronic component 254 in a face to face orientation.

In the following embodiments of the invention are presented wherein a stepped component assembly comprises an intermediate electronic structure such as an IC-substrate, an interposer, or a through silicon via connection (TSV), which is arranged between two electronic components and which electrically connects the two electronic components with each other.

In the beginning of manufacturing corresponding electronic packages there is always provided a component carrier respectively a printed circuit board (PCB) within which there is formed a (stepped) cavity. The cavity can be realized for instance by milling and/or by drilling. Forming such a cavity can also be realized with a laminate having a so-called release layer provided between two neighboring electrically insulating layer structures. Thereby, an electrically insulating layer structure being arranged directly above or below such a release layer is cut along a closed line such that a piece of the electrically insulating layer structure is cut out. By making the release layer non adhesive, e.g. by heating up, the cut-out piece can be removed and an opening respectively a cavity remains within the respective electrically insulating layer structure.

The component carrier respectively the PCB in which a stepped component assembly is inserted at least partially can be used as a mounting base for additional electronic components which can be attached for instance by means of surface mounting. Thereby, additional electronic components may be mounted on one or on both sides of the component carrier. Further, additional build-up structures can be formed on one surface or on both surfaces of the component carrier. An example for an additional build-up is a (fan out) redistribution layer or redistribution structure. However, the component carrier can also be used simply for encapsulating the stepped component assembly and, e.g. by means of metallized via connections, for electrically connecting the electronic components of the stepped component assembly to the "outside world". In the latter case the component carrier can be dimensioned such that it represents an electronic package for the stepped component assembly.

Figure 3:
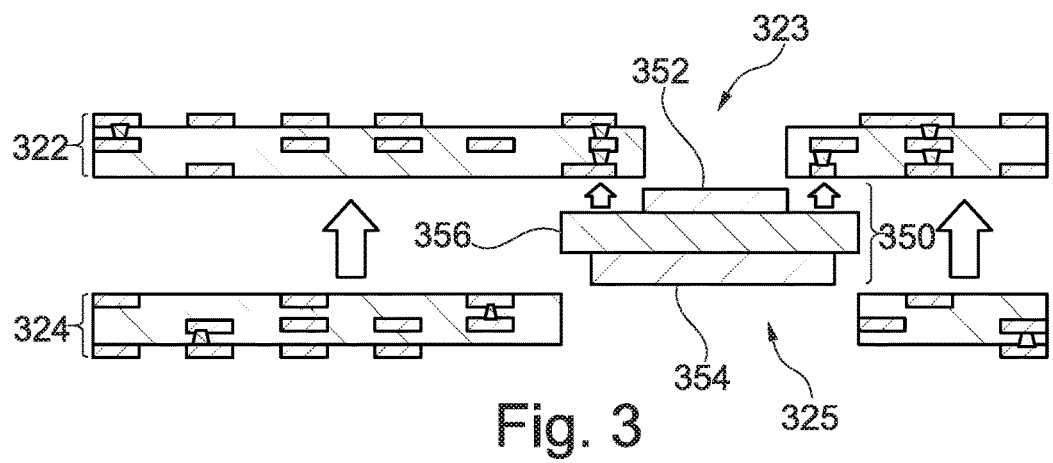
FIG. 3 illustrates a fabrication of an electronic package wherein (a) in a first step a stepped component assembly comprising two electronic components and an intermediate electronic structure connected between the two electronic components is attached to a first component carrier portion having a first opening and (b) in a second step a second component carrier portion is laminated to the first component carrier portion such that the component assembly is integrated or embedded.

FIG. 3 illustrates a fabrication of an electronic package wherein the component carrier of the electronic package is assembled from two component carrier portions after a stepped component assembly has been inserted partially into an opening of one of the two component carrier portions.

Specifically, according to the embodiment described here there is provided a first component carrier portion 322 and a second component carrier portion 324. Each one of the two component carrier portions 322 and 324 are well-known laminates comprising a layer sequence of electrically insulating layer structures and electrically conductive layer structures. Metallized (conical or tapered) vias are provided in order to electrically connect different electrically conductive layer structures. Since the process of structuring, laminating, and via interconnecting is well known to the skilled person in the drawing the respective components/materials are not denominated with reference numerals and no further details about possible techniques for forming the two component carrier portions 322 and 324 are elucidated for the sake of conciseness of this document.

As can be seen from FIG. 3, the first component carrier portion 322 comprises a first opening 323 and the second component carrier portion 324 comprises a second opening 325. Since the first opening 323 has a lateral extension which is smaller than the second opening 325, in this document the first opening is called narrow(er) opening 323 and the second opening is called wide(r) opening 325.

The stepped component assembly, which is denominated with reference numeral 350, comprises an intermediate electronic structure 356 and two electronic components 352 and 354. According to the embodiment described here the intermediate electronic structure is an interposer 356 having the first electronic component 352 mounted at its upper surface and the second electronic component 354 mounted at its lower surface. The intermediate electronic structure 356 comprises non-depicted connection circuitry which provides for a proper electrically contact between the two electronic components 352, 354. In some embodiments the intermediate electronic structure 356 comprises non-depicted embedded passive electronic components such as capacitors and/or resistors, which may be formed within one interconnection layer or more interconnection layers of the intermediate electronic structure 356. The first electronic component 352 may be for instance a memory such as a DRAM. The second electronic component 354 may be for instance a processor being in communication with the memory 352 via a plurality of non-depicted conductor elements extending (vertically) through the intermediate electronic structure 356.

In a first step the component assembly 350 is attached to the first component carrier portion 322 in such a manner that the first electronic component 352 fits into the first opening 323. According to the embodiment described here the intermediate electronic structure 356 is, along a lateral direction, wider then both the first electronic component 352 and the second electronic component 354. As can be seen from FIG. 3, the component assembly 350 is attached to the first component carrier portion 322 in such a manner that free upper surface portions of the intermediate electronic structure 356 are in direct contact with a lower surface of the first component carrier portion 322.

In a second step the second component carrier portion 324 is attached to the first component carrier portion 322 by means of an appropriate laminating procedure. Thereby, the second component carrier portion 324 is, along a lateral direction, aligned with respect to the component assembly 350 in such a manner that the second opening 325 can accommodate the intermediate electronic structure 356. Depending on the (vertical) thickness of the second component carrier portion 324 the second electronic component 354 will (a) also be at least partially accommodated within the opening 325 (when the second component carrier portion 324 is comparatively thick) or (b) be located outside from the openings 325 respectively the second component carrier portion 324 (when the second component carrier portion 324 is comparatively thin). Anyway, after laminating the two component carrier portions 322, 324 with each other at least a part of the component assembly 350, namely the first electronic component 352 and the intermediate electronic structure 356, are accommodated within a stepped cavity being realized by both the wide opening 325 and the narrow opening 323.

It is mentioned that optionally between the two component carrier portions 322 and 324 there may be inserted a so-called B-stage laminate. Such a B-stage laminate is an at least partially uncured material as has been elucidated above in detail. Providing such a partially uncured material between the two component carrier portions 322, 324 may provide the advantage that when laminating the two component carrier portions 322 and 324 to each other the inter-mediate electronic structure 356 will be laterally fixed due to the pressure during lamination and a corresponding flow of uncured material around the interposer 356.

It is further mentioned that a structure comprising the two component carrier portions 322 and 324 and the embedded stepped component assembly 350 can be further processed by providing additional non depicted layers or build-up structures at the upper surface and/or at the lower surface of the laminated component carrier comprising the two component carrier portions 322 and 324.

Furthermore, it is mentioned that according to the embodiment depicted in FIG. 3 the intermediate electronic structure 356 has a larger lateral extension then both the first electronic component 352 and the second electronic component 354. However, also other geometries respectively dimensions may be possible. For instance, the intermediate electronic structure may have a width which (a) is at least approximately the same as the (larger) second electronic component, (b) is smaller than the second electronic component but larger than the first electronic component, or (c) is at least approximately the same as the (smaller) first electronic component.

Figure 4:
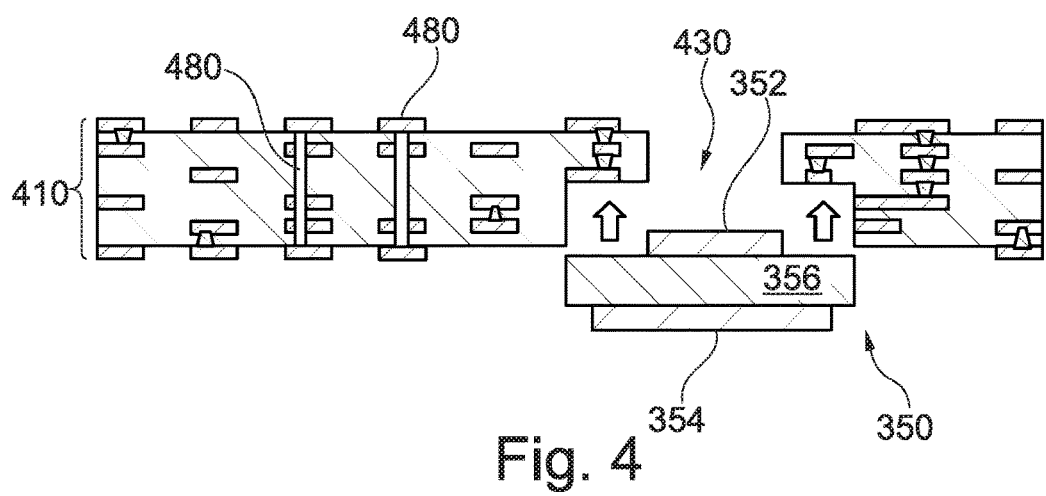
FIG. 4 illustrates a fabrication of an electronic package wherein a stepped component assembly again comprising two electronic components and an intermediate electronic structure connected between the two electronic components is inserted into a stepped cavity formed within a component carrier.

FIG. 4 illustrates a fabrication of an electronic package wherein there is provided a component carrier 410, which also comprises a layer sequence of electrically insulating layer structures and electrically conductive layer structures as well as metallized vias for electrically connecting different electrically conductive layer structures. By contrast to the embodiment illustrated in FIG. 3, the provided component carrier 410 comprises already a stepped cavity 430. Thereby, different cavity portions having a different width are formed within different layers of the already fully laminated component carrier 410.

The component assembly 350 known already from FIG. 3 is inserted into the stepped cavity 430. This insertion is indicated by the bold arrows. According to the embodiment described here the lower and wider cavity portion has a thickness which allows (i) the intermediate electronic structure 356 to be fully accommodated within the cavity 430 and (ii) the second electronic component 154 to be only partially accommodated within the cavity 430.

As can be further taken from FIG. 4, there are provided two vertical heat conductive structures 480, which extend completely through the component carrier 410. The vertical heat conductive structures may be realized for in-stance by means of heat pipes 480.

Also, here it is mentioned that a structure resulting from the insertion of the component assembly 350 into the stepped cavity 430 may be further processed by providing additional non depicted layers or build-up structures at the upper surface and/or at the lower surface of the component carrier 410.

Figure 5:
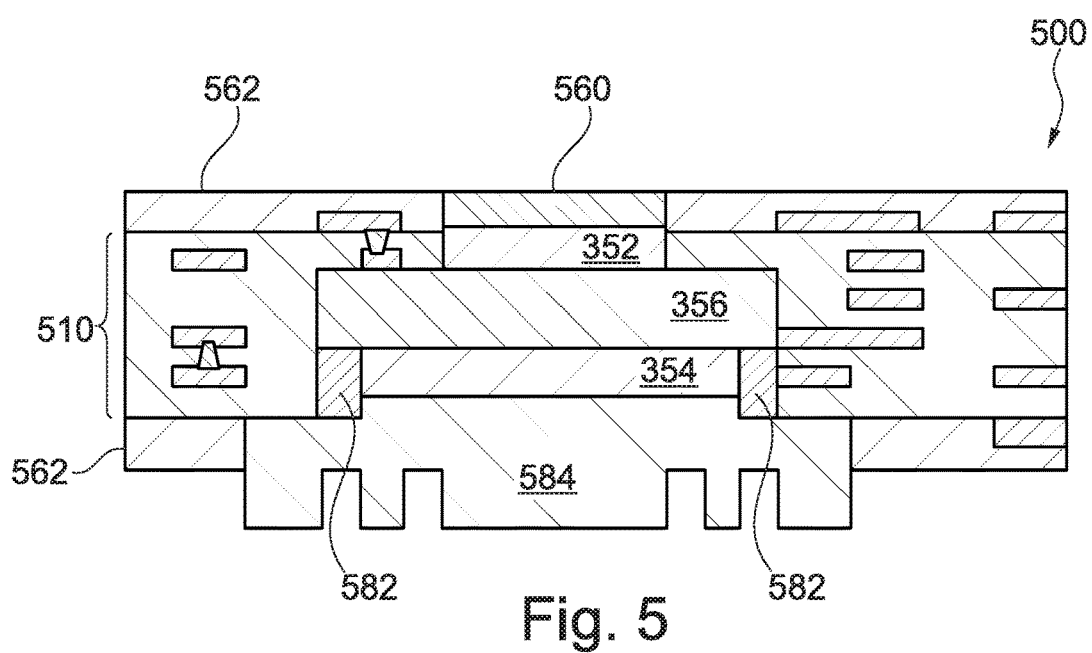
FIG. 5 shows an electronic package with a heat sink being mounted at a lower surface of the component carrier and being thermally coupled to an embedded stepped component assembly.

FIG. 5 shows an electronic package 500 in accordance with an embodiment of the invention. The electronic package 500 comprises a component carrier 510 which includes a layer sequence of electrically insulating layer structures and electrically conductive layer structures as well as metallized vias. A stepped cavity, which is formed within the component carrier 510, accommodates a stepped component assembly, which is known already from FIG. 3 and which comprises two electronic components 352 and 354 and an intermediate electronic structure 356 being arranged in between the two electronic components 352, 354.

As can be seen from FIG. 5, the lower (and wider) portion of the stepped cavity accommodates the intermediate electronic structure 356, the second electronic component 354, heat conductive elements or structures 582, and a part of a heat sink 584. According to the embodiment described here, the heat sink 584 is thermally coupled to the second electronic component 354 in a direct manner. Further, the intermediate electronic structure 356 is thermally coupled to the heat sink 584 in an indirect manner via the heat conductive elements 582.

As can be further seen from FIG. 5, at the bottom of the component carrier 510 and next to the heat sink 584 there is formed a solder resist layer 562. A (further) solder resist layer 562 is also formed at the top of the component carrier 510 at least within a region being laterally different from the first electronic component 352. The upper surface of the first electronic component 352 is mechanically and/or chemically protected by means of a mold structure 560.

The integrated heat sink 584 as well as the integrated heat conductive elements 582 contribute to an excellent heat dissipation within the described electronic package 500. Again, additional non depicted layers or build-up structures may be provided at the upper surface and/or at the lower surface of the depicted electronic package 500. Such additional layers or structures may be used as a mounting base for mounting (and electrically connecting) further non depicted electronic components e.g. by means of surface mounting.

Figure 6:
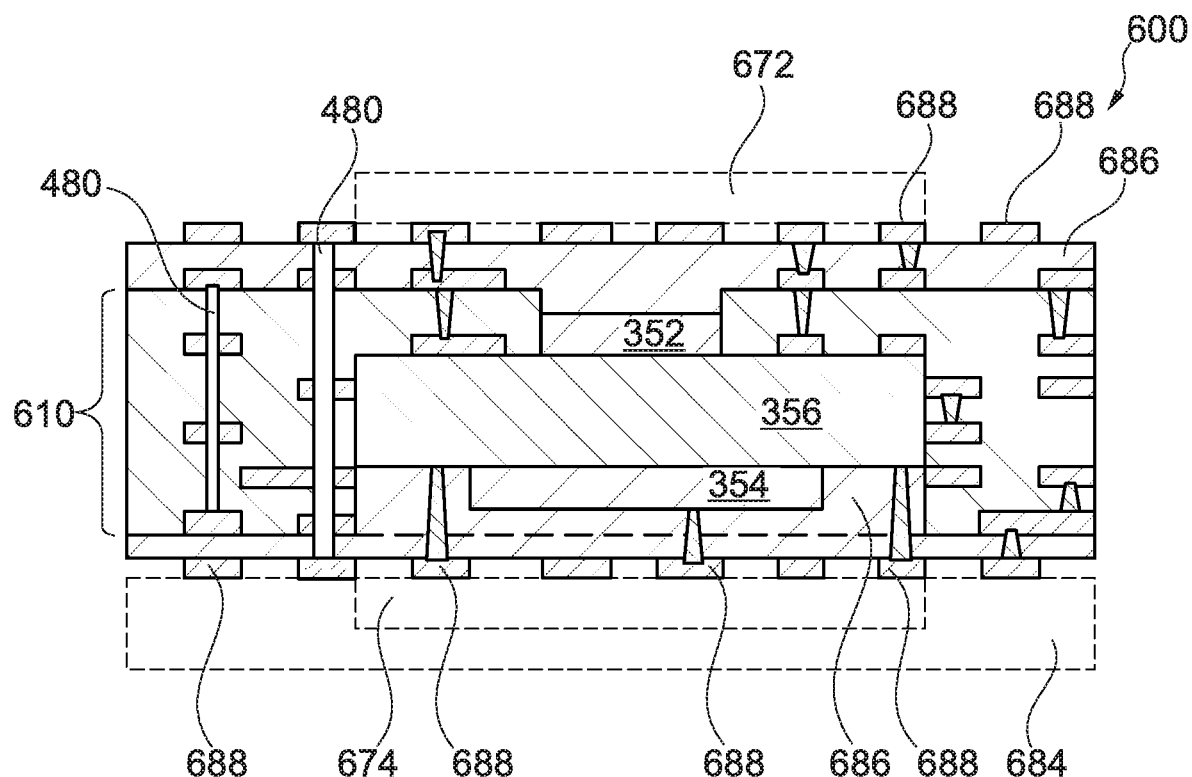
FIG. 6 shows an electronic package with two heat conductive layer structures for carrying away heat generated by an embedded stepped component assembly.

FIG. 6 shows an electronic package 600 in accordance with a further embodiment of the invention. Also, the electronic package 600 comprises a component carrier 610 which includes a layer sequence of electrically insulating layer structures and electrically conductive layer structures as well as metallized (interconnecting) vias. Within the stepped cavity there is accommodated the already above described stepped component assembly comprising the intermediate electronic structure 356 and the two electronic components 352 and 354.

On top of the component carrier 610 there is formed an upper heat conductive layer structure 686, which also fills at least partially the upper (narrower) portion of the stepped cavity, into which the first electronic component 352 is embedded. On top of the upper heat conductive layer structure 686 there is formed an upper structured metallic layer which comprises several (upper) conductor pads 688. A first electronic assembly 672 is electrically connected to the intermediate electronic structure 356 of the embedded stepped component assembly by means of via connections each comprising two metallized vias. Thereby, a first via of the respective via connection extends through the upper heat conductive layer structure 686 and the second via of the respective via connection extends through an upper portion of the component carrier 610. The first electronic assembly 672, which is only depicted schematically, may be an electronic circuit comprising e.g. capacitors, memory devices. Such types of components and also further types of components may be mounted on a further PCB such as a motherboard of the first electronic assembly 672.

At the bottom surface of the component carrier 610 there is formed a lower heat conductive layer structure, which is also denominated with reference numeral 686. As can be seen from FIG. 6, the lower heat conductive layer structures 686 fills a part of the lower (wider) portion of the stepped cavity, into which the intermediate electronic structure 356 and the second electronic component 354 are embedded. At the lower surface of the lower heat conductive layer structure 686 there is formed a lower structured metallic layer which comprises several (lower) conductor pads 688. As can be further seen from FIG. 6, some of the (lower) conductor pads 688 are electrically connected by means of a direct via connection to either the intermediate electronic structure 356 or the second electronic component 354. A second electronic assembly 674 is electrically connected to some of the (lower) conductor pads 688. The second electronic assembly 674, which may comprise an electronic circuit including capacitors and/or resistors, is illustrated only schematically.

According to the embodiment described here the electronic package 600 further comprises a heat sink 684, which may be realized by any appropriate heat conductive material, which is thermally coupled to the second electronic assembly 674 in order to provide sufficient heat dissipation. Further, as can be seen from FIG. 6, also in this embodiment there are provided vertical heat conductive structures 480, which extend vertically through the component carrier 610.

Figure 7:
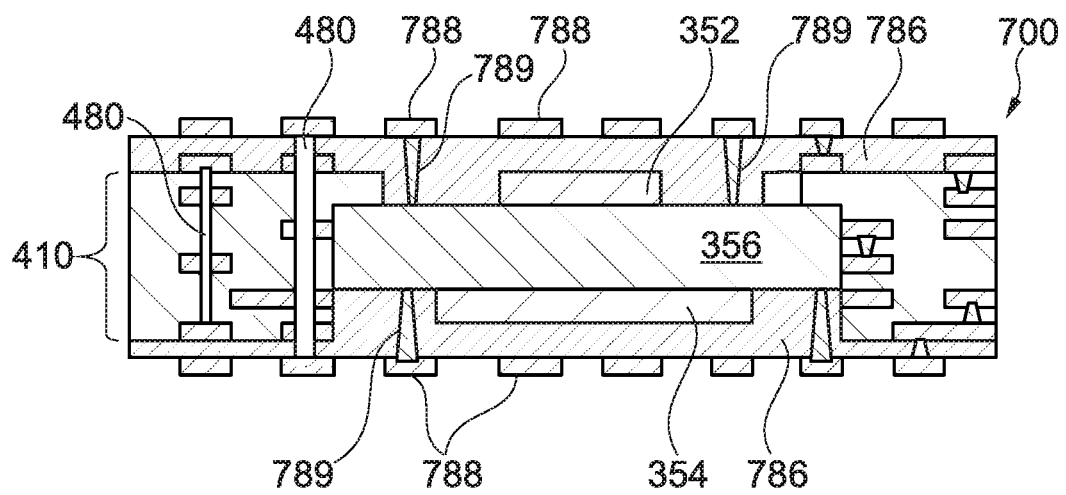
FIG. 7 shows an electronic package with a direct electric connection of an intermediate electronic structure of an embedded stepped component assembly by means of metallized vias extending though a heat conductive layer structure.
Figures 8A, 8B, 8C, 8D, 8E, 8F:
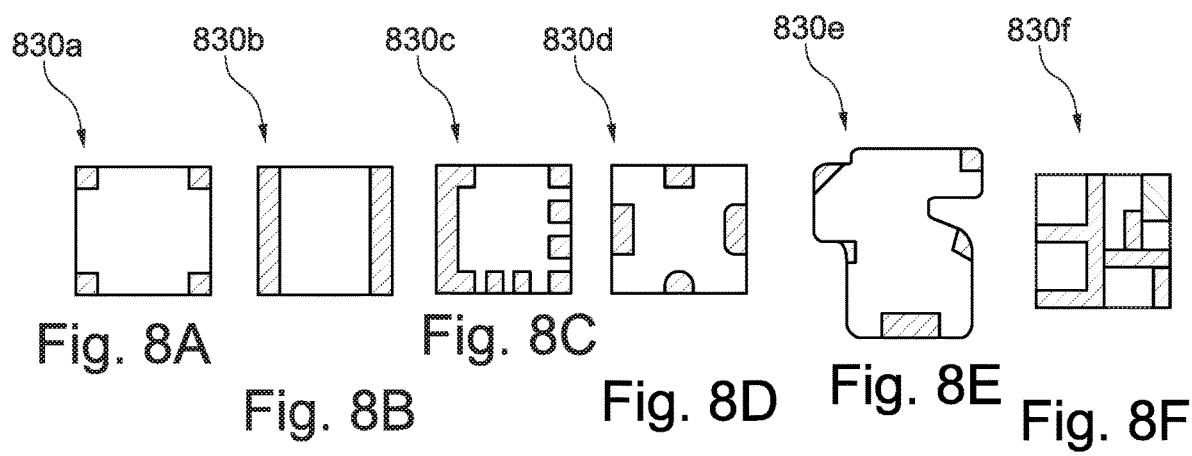
FIGS. 8A, 8B, 8C, 8D, 8E and 8F show in a top view different geometric designs of a stepped cavity.

FIG. 7 shows an electronic package 700, which is similar to the electronic package 600 depicted in FIG. 6. Optional electronic assemblies, which may be attached at the upper side of an (upper) heat conductive layer structure 786 and/or at the lower side of a (lower) heat conductive layer structure 786 are not depicted for the ease of illustration. By contrast to the electronic package 600 the intermediate electronic structure 356 is electrically connected both (i) to conductor pads 788 formed at the upper surface and (ii) to lower conductor pads 788 formed at the lower surface. All these electric connections are realized by means of a single metallized via 789.

As can be taken from FIG. 7, a direct electric connection from the upper conductor pads 788 to the intermediate electronic structure 356 requires that the upper portion of the stepped cavity is (significantly) wider than the width of the first electronic component 352. This means, that by contrast to the electronic package 600 in the embodiment described in FIG. 7 the upper heat conductive layer structure 786 is not only in contact with a top surface of the first electronic component 352 but is also in contact with side walls of the first electronic component 352.

FIGS. 8A to 8F show in a top view different geometric designs of a stepped cavity. In each one of these Figures, the area being defined by the sum of the hatched area portions and the non-hatched area portion is the wider portion of the respective stepped cavity 830a, 830b, 830c, 830d, 830e, or 830f. The non-hatched portion illustrates the narrower portion of the respective stepped cavity. One can conclude that for realizing the stepped cavity many different thinkable geometries are possible which allow for a reliable accommodation of the component assembly within the respective stepped cavity.

Figure 9:
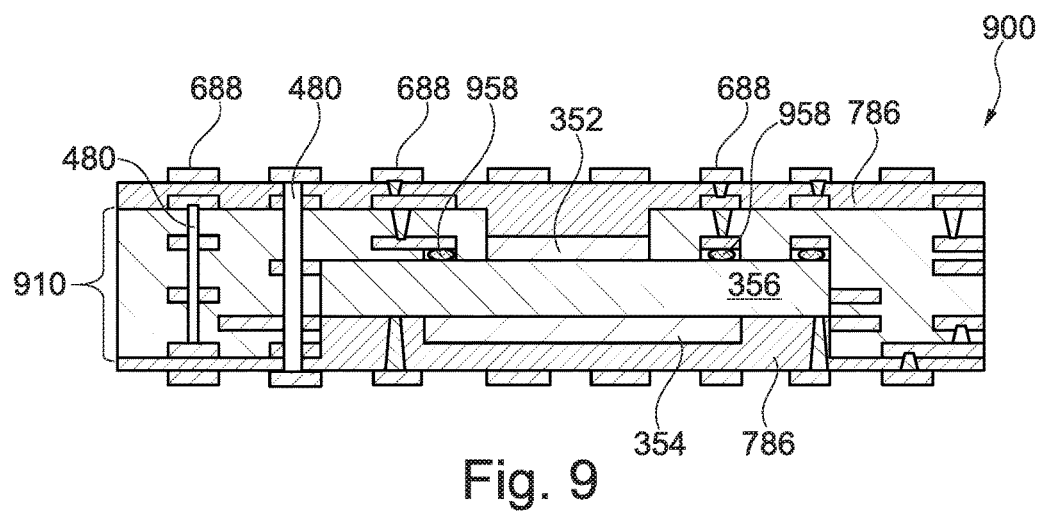
FIG. 9 shows an electronic package with a solder deposit for electrically connecting an intermediate electronic structure of an embedded stepped component assembly during a lamination process of different component carrier portions.

FIG. 9 shows an electronic package 900 according to a further embodiment of the invention. The electronic package 900 is similar to the electronic pack-age 600 depicted in FIG. 6. For the ease of illustration, the optional component assemblies 672 and 674 as well as the optional heat sink 684, which are depicted in FIG. 6, are not shown in FIG. 9.

In the electronic package 900 the upper surface of the intermediate electronic structure 356 is connected to some of the (upper) conductor pads 688 by means of (i) a via connection comprising two metallized vias extending through an upper portion of a component carrier 910 and (ii) a solder ball connection 958. The electric solder ball connection 958 may be realized e.g. by means of a thermal compression bonding procedure or by means of an appropriate electric conductive paste or adhesive. By exposing electrically conductive pads within the component carrier 910 deposits for such materials can be provided.

It should be noted that the term "comprising" does not exclude other elements or steps and the use of articles "a" or "an" does not exclude a plurality. Also, elements described in association with different embodiments may be combined.

LIST OF REFERENCE SIGNS 100 electronic package
110 component carrier
112 electrically insulating layer
114 electrically conductive layer
116 via
123 first opening/narrow opening
125 second opening/wide opening
130 stepped cavity
150 component assembly
150a central axis
152 first electronic component/first semiconductor die
154 second electronic component/second semiconductor die
156 electric connection elements
190 gap
200a/b electronic package
210 component carrier
212 additional electrically insulating layer
212a passage
223 first opening/narrow opening/blind hole opening
250 component assembly (with two electronic components)
252 first electronic component/first semiconductor die
254 second electronic component/second semiconductor die
322 first component carrier portion
323 first opening/narrow opening
324 second component carrier portion
325 second opening/wide opening
350 component assembly
352 first electronic component
354 second electronic component
356 intermediate electronic structure/interposer
410 component carrier
430 stepped cavity
480 vertical heat conductive structure/heat pipe
500 electronic package
510 component carrier
560 protection material/mold structure
562 solder resist
582 heat conductive elements/heat conductive structures
584 heat sink
600 electronic package
610 component carrier
672 first electronic assembly/capacitors/SSD device/motherboard
674 second electronic assembly/capacitors/resistors
684 heat conductive material/heat sink
686 heat conductive layer structure
688 conductor pads
700 electronic package
786 heat conductive layer structure
788 conductor pads
789 direct via connection
830a-e stepped cavity
900 electronic package
910 component carrier
958 solder ball connection

The invention claimed is:

1. An electronic package, comprising:
a component carrier having a stepped cavity formed therein; and
a component assembly with at least two electrically connected electronic components having different sizes such that the component assembly has a stepped shape;
wherein the component assembly is accommodated at least partially inserted within the stepped cavity;
wherein the component assembly comprises an intermediate electric structure, wherein the two electronic components are attached at opposing main surfaces of the intermediate electric structure.

2. The electronic package as set forth in the preceding claim, wherein at least one of the at least two electronic components is a semiconductor chip, a substrate, an interposer, or a through silicon via connection.

3. The electronic package as set forth in claim 1, wherein the at least two electronic components are connected face to face.

4. The electronic package as set forth in claim 1, wherein the stepped cavity forms a through hole opening or a blind hole opening within the component carrier.

5. The electronic package as set forth in claim 1, wherein the component carrier further comprises:
- a first component carrier portion having a first opening formed therein, wherein the first opening corresponds to a narrower portion of the stepped cavity; and
- a second component carrier portion having a second opening formed therein, wherein the second opening corresponds to a wider portion of the stepped cavity.

6. The electronic package as set forth in claim 1, wherein the component assembly is vertically embedded within the component carrier.

7. The electronic package as set forth in claim 1, wherein an upper surface of the component assembly is located within a plane being defined by an upper surface of the component carrier.

8. The electronic package as set forth in claim 1, further comprising:
- a first through hole connecting the exterior of the component carrier with the component assembly,
- wherein the electronic package further comprises
- at least one additional through hole, wherein the first through hole and the at least one additional through hole have a different cross-sectional area.

9. The electronic package as set forth in claim 1, wherein at least one electronic component of the at least two electronic components of the electronic assembly is a sensor.

10. The electronic package as set forth in claim 1, wherein the electronic package further comprises:
- a heat conduction element being in thermal contact with the component assembly and/or the component assembly further comprises:
- a third electronic component being electrically connected with at least one of the two electrically connected electronic components.

11. A method of manufacturing an electronic package, the method comprising:
- forming a component carrier with a stepped cavity;
- providing a component assembly comprising at least two electrically connected electronic components having different sizes such that the component assembly has a stepped shape; and
- inserting the component assembly in the stepped cavity such that the component assembly is accommodated at least partially within the stepped cavity;
- wherein the component assembly comprises an intermediate electric structure, wherein the two electronic components are attached at opposing main surfaces of the intermediate electric structure.

12. The method as set forth in the claim 11, wherein forming a component carrier comprises:
- providing a first component carrier portion having a first opening formed therein, wherein the first opening corresponds to a narrower portion of a stepped cavity, which comprises the first opening and a second opening corresponding to a wider portion of the stepped cavity;
- providing a second component carrier portion; and
- attaching the two component carrier portions to each other.

13. The method as set forth in the claim 12, wherein the provided second component carrier portion has the second opening or
the second opening is formed within the second component carrier portion after attaching the two component carrier portions to each other.

14. The method as set forth in claim 12, wherein before attaching the two component carrier portions to each other, the method further comprises:
- attaching the stepped component assembly to the first component carrier portion such that a first portion of the stepped component assembly is inserted within the first opening and/or
- attaching the stepped component assembly to the second component carrier portion such that a second portion of the stepped component assembly is inserted within the second opening.

15. An electronic package, comprising:
- a component carrier having a stepped cavity formed therein;
- a component assembly with at least two electrically connected electronic components having different sizes such that the component assembly has a stepped shape;
- wherein the component assembly is accommodated at least partially within the stepped cavity;
- wherein the electronic package further comprises a first through hole extending from the exterior of the component carrier to the component assembly,
- wherein the electronic package further comprises a second through hole, wherein the first through hole and the second through hole have a different cross-sectional area.

* * * * *